(12) United States Patent
Park

(10) Patent No.: US 8,780,630 B2
(45) Date of Patent: Jul. 15, 2014

(54) OPERATING METHOD OF SEMICONDUCTOR DEVICE

(75) Inventor: Jin Su Park, Daegu (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 135 days.

(21) Appl. No.: 13/455,558

(22) Filed: Apr. 25, 2012

(65) Prior Publication Data

US 2012/0275224 A1    Nov. 1, 2012

(30) Foreign Application Priority Data

Apr. 26, 2011    (KR) .................. 10-2011-0038986

(51) Int. Cl.
*G11C 16/04*    (2006.01)

(52) U.S. Cl.
USPC ............. 365/185.11; 365/185.18; 365/185.24

(58) Field of Classification Search
USPC ............. 365/185.11, 185.14, 185.17, 185.18, 365/185.23, 185.22, 195, 196
See application file for complete search history.

(56) References Cited

U.S. PATENT DOCUMENTS

| | | | | |
|---|---|---|---|---|
| 5,095,344 A * | 3/1992 | Harari | ............................ | 257/328 |
| 7,020,026 B2 * | 3/2006 | Guterman et al. | ........ | 365/185.28 |
| 7,436,733 B2 * | 10/2008 | Mokhlesi | ................. | 365/230.06 |
| 7,535,769 B2 * | 5/2009 | Cernea | ..................... | 365/185.22 |
| 8,374,038 B2 * | 2/2013 | Yu et al. | .................... | 365/185.29 |
| 2009/0147572 A1 * | 6/2009 | Aritome | .................... | 365/185.03 |
| 2010/0226173 A1 * | 9/2010 | Tanaka et al. | .............. | 365/185.3 |

FOREIGN PATENT DOCUMENTS

| | | |
|---|---|---|
| KR | 1020020055254 | 7/2002 |
| KR | 1020080084230 | 9/2008 |
| KR | 1020090094350 | 9/2009 |

OTHER PUBLICATIONS

Office Action issued by the Korean Intellectual Property Office on Sep. 20, 2012.

* cited by examiner

*Primary Examiner* — Gene Auduong
(74) *Attorney, Agent, or Firm* — IP & T Group LLP

(57) ABSTRACT

An operating method of a semiconductor device that includes a plurality of memory cell blocks, comprising selecting one of the memory cell blocks in response to a program command, performing a pre-program operation and a pre-erase operation so that threshold voltages of memory cells included in the selected memory cell block are distributed between a first positive voltage and a first negative voltage, supplying a program permission voltage to a first group of bit lines and supplying a program inhibition voltage to a second group of bit lines, wherein the first group and the second group are mutually exclusive, and supplying a positive program voltage to a selected word line coupled to memory cells.

30 Claims, 7 Drawing Sheets

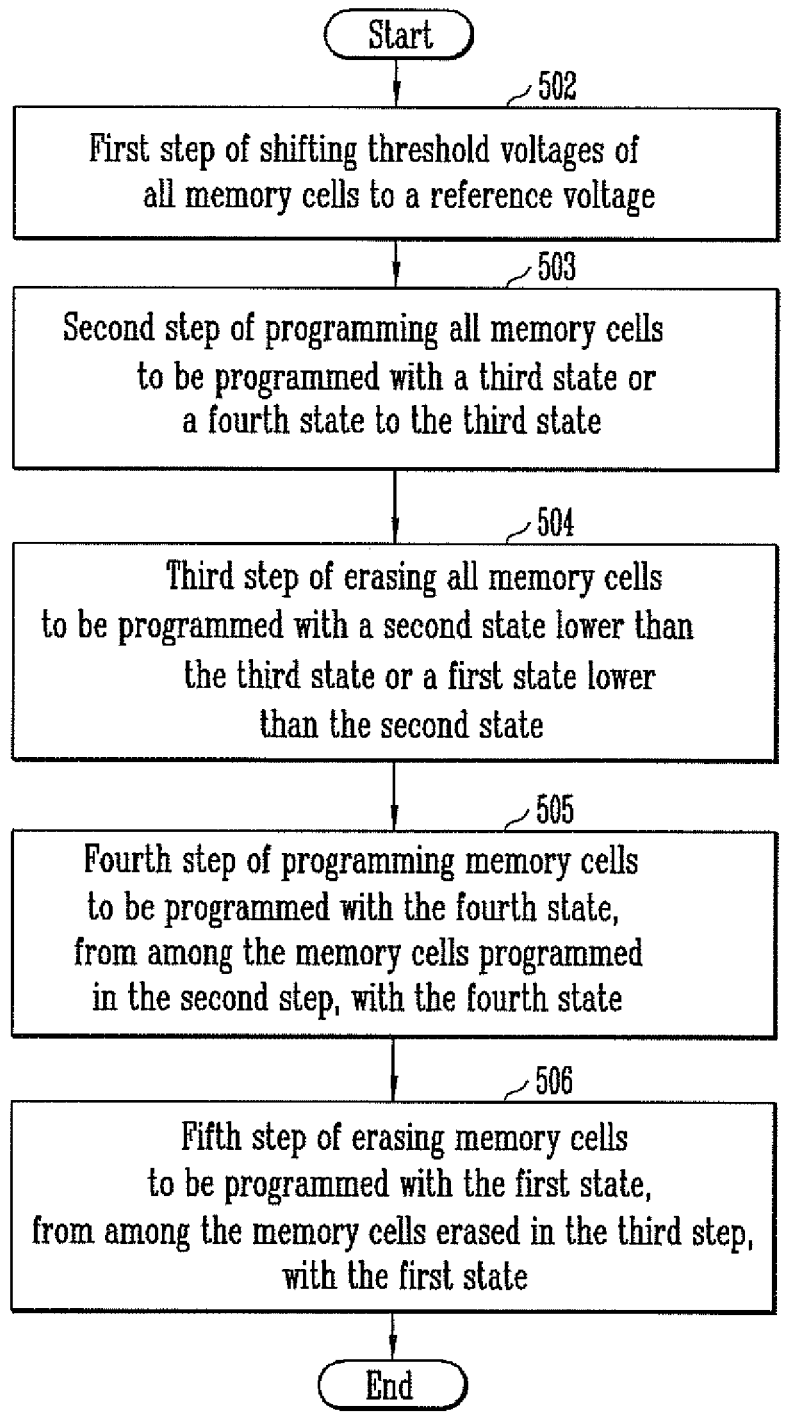

OPERATING METHOD OF SEMICONDUCTOR DEVICE

CROSS-REFERENCE TO RELATED APPLICATION

Priority to Korean patent application number 10-2011-0038986 filed on Apr. 26, 2011, the entire disclosure of which is incorporated by reference herein, is claimed.

BACKGROUND

Exemplary embodiments relate to an operating method of a semiconductor device and, more particularly, to a program method.

The operation of a semiconductor device is may be classified into program, read, and erase operations.

The program operation refers to an operation of raising the threshold voltage of a memory cell by supplying a high program voltage (for example, 20 V) to a word line coupled to the memory cell. The read operation refers to an operation of determining the program state of a memory cell according to whether the threshold voltage of the memory cell is higher than or lower than a verify voltage by supplying a read voltage to a word line coupled to the memory cell. The erase operation refers to an operation of lowering the threshold voltage of a memory cell by supplying an erase voltage to a well.

A memory cell that can be programmed in one state is called a Single Level Cell (SLC), and a memory cell that can be programmed in a plurality of states is called a Multi-Level Cell (MLC).

The MLC is being used in semiconductor devices because the MLC is more suitable for a higher capacity. A program operation of the MLC is described below.

FIGS. 1A and 1B are graphs illustrating a conventional program method. More specifically, a method of programming one memory cell with first, second, and third states P1, P2, and P3 is described below.

Referring to FIG. 1A, after all the memory cells of a specific memory cell block are erased, a Least Significant Bit (LSB) program operation is performed on a page (more specifically, a page is a group of memory cells coupled to the same word line) selected from among the pages of the memory cell block. The LSB program operation is performed to raise the threshold voltages of memory cells that are to be programmed with the second state P2 or the third state P3, which is higher than the second state P2, from among the memory cells included in the selected page. After the threshold voltages of the memory cells to be programmed with the second or third state P2 or P3 are raised, a Most Significant Bit (MSB) program operation is performed on the selected page.

The MSB program operation is performed to raise the threshold voltages of memory cells that are to be programmed with the first state P1 higher than an erase state ER, but lower than the second state P2 or the third state P3, from among the memory cells included in the selected page. More specifically, the threshold voltages of memory cells that are to be programmed with the first state P1 from among memory cells of the erase state ER are raised by performing the MSB program operation. Furthermore, the threshold voltages of memory cells that are to be programmed with the second state P2 or the third state P3 from among the memory cells on which the LSB program operation has been performed are raised by performing the MSB program operation.

Particularly, in the program operation to program memory cells in the third state P3, a high program voltage is used because the threshold voltages of relevant memory cells are stepwise raised from the erase state ER to the third state P3.

However, the threshold voltages of memory cells that have been programmed may be shifted because interference on memory cells adjacent to a selected word line is further increased according to an increase of a program voltage supplied to the selected word line. If the threshold voltages of the memory cells are shifted, data read out by a read operation may not be reliable.

BRIEF SUMMARY

In accordance with exemplary embodiments, a program operation is performed by supplying a positive or negative program voltage, instead of a high program voltage, to a word line so that memory cells coupled to the word line are programmed to have various positive threshold voltages or various negative threshold voltages.

An operating method of a semiconductor device that includes a plurality of memory cell blocks, comprising: selecting one of the memory cell blocks in response to a program command; performing a pre-program operation and a pre-erase operation so that threshold voltages of memory cells included in the selected memory cell block are distributed between a first positive voltage and a first negative voltage; supplying a program permission voltage to a first group of bit lines and supplying a program inhibition voltage to a second group of bit lines, wherein the first group and the second group are mutually exclusive; and supplying a positive program voltage to a selected word line coupled to memory cells.

An operating method of a semiconductor device that includes a plurality of memory cell blocks on which a program operation has been performed, comprising: selecting one of the memory cell blocks in response to a program command; performing a pre-program operation and a pre-erase operation so that threshold voltages of memory cells included in the selected memory cell block are distributed between a first positive voltage and a first negative voltage; supplying a program permission voltage to a first group of bit lines and supplying a program inhibition voltage to a second group of bit lines, wherein the first group and the second group are mutually exclusive; performing a first positive program operation so that threshold voltages of memory cells that are selected from among the memory cells reach a first positive target voltage; and performing a second positive program operation so that threshold voltages of memory cells that are selected from among the memory cells each having the threshold voltage that reached the first positive target voltage reach a second target voltage higher than the first positive target voltage.

BRIEF DESCRIPTION OF THE DRAWINGS

FIG. 5 is a flowchart illustrating a program operation of the semiconductor device according to an embodiment of this disclosure;

DESCRIPTION OF EMBODIMENTS

Hereinafter, exemplary embodiments of the present disclosure will be described in detail with reference to the accompanying drawings. The figures are provided to allow those having ordinary skill in the art to understand the scope of the embodiments of the disclosure.

Figure 1A:
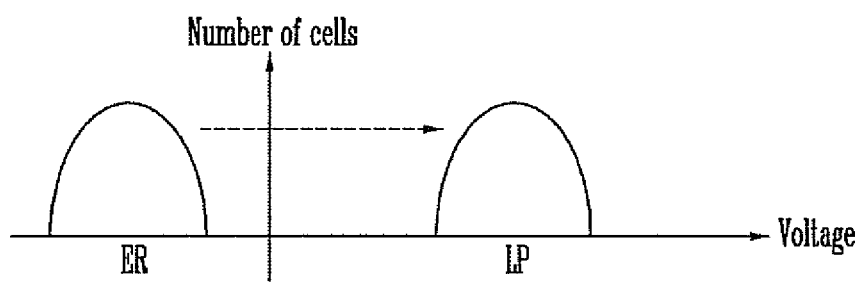
FIGS. 1A and 1B are graphs illustrating a conventional program method.
Figure 1B:
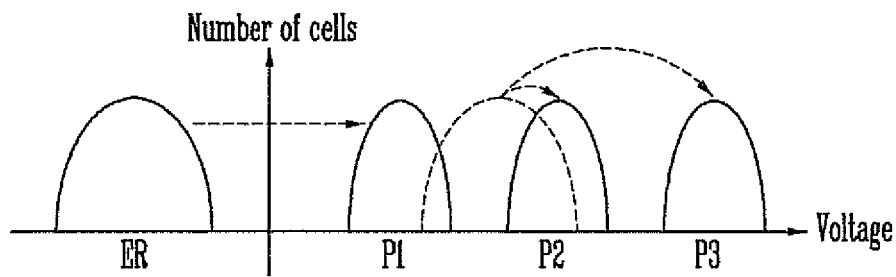
Figure 2:
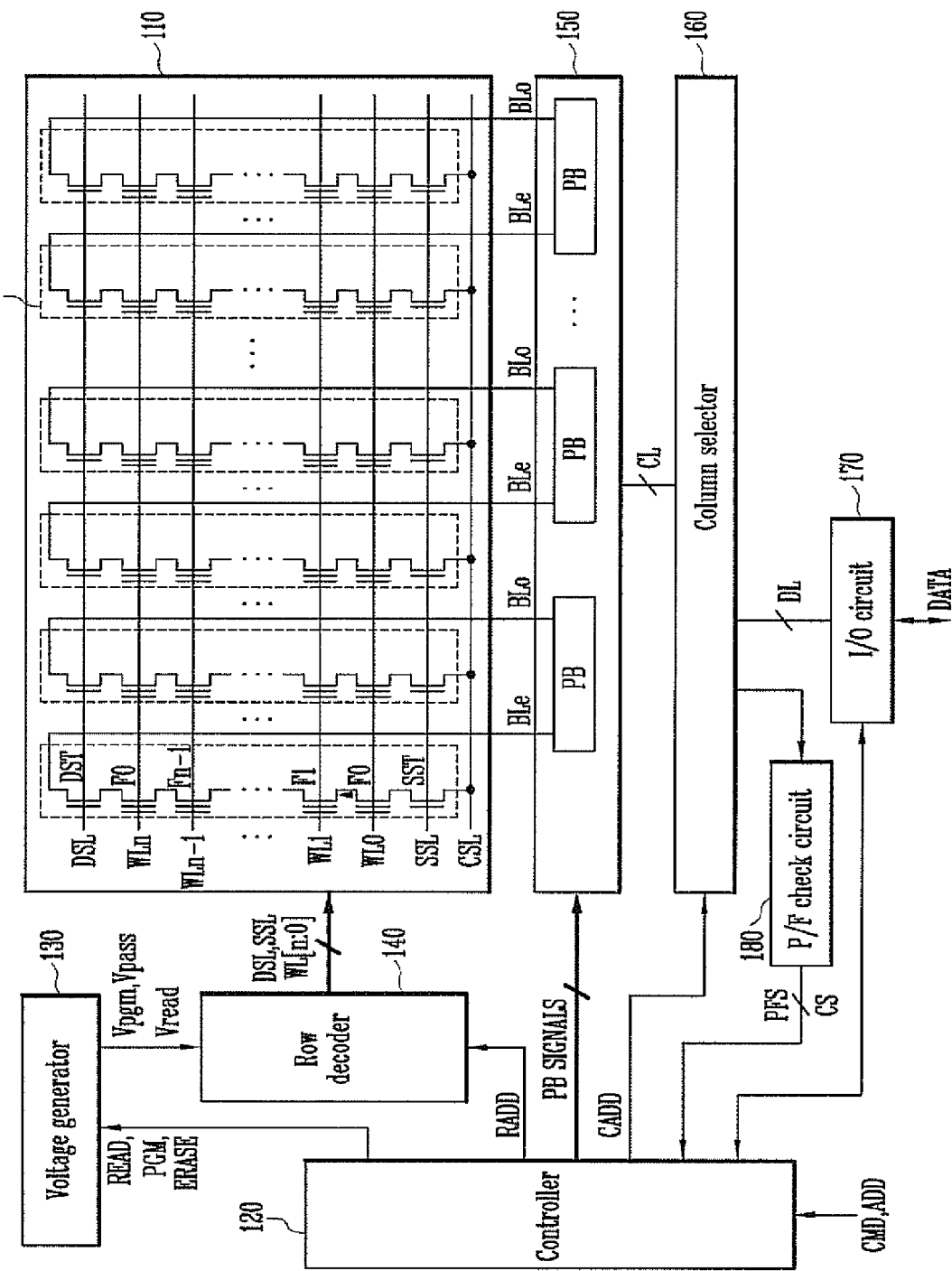
FIG. 2 is a block diagram of a semiconductor device for illustrating a program method according to this disclosure.

FIG. 2 is a block diagram of a semiconductor device for illustrating a program method according to this disclosure.

Referring to FIG. 2, the semiconductor memory device includes a memory cell array 110, a plurality of circuits (130, 140, 150, 160, 170, and 180), and a controller 120. The plurality of circuits (130, 140, 150, 160, 170, and 180) are configured to perform a program operation or a read operation on the memory cells included in the memory cell array 110. The controller 120 is configured to control the plurality of circuits (130, 140, 150, 160, 170, and 180) so that the plurality of circuits (130, 140, 150, 160, 170, and 180) sets the threshold voltages of selected memory cells in response to received data.

In a NAND flash memory device, the plurality of circuits includes a voltage generator 130, a row decoder 140, a page buffer group 150, a column selector 160, an I/O circuit 170, and a Pass/Fail (P/F) check circuit 180.

The memory cell array 110 includes a plurality of memory cell blocks. One memory cell block is shown in FIG. 2, and the memory cell block of FIG. 2 may be selected by the following method. The memory cell block includes a plurality of strings ST. The plurality of strings ST includes normal strings and flag strings, and the normal strings and the flag strings have the same construction. Each of the strings ST includes a source select transistor SST coupled to a common source line CSL, a plurality of memory cells F0 to Fn, and a drain select transistor DST coupled to a bit line BLe or BLo. Memory cells included in the flag string are called flag cells, but the flag cells have the same construction as memory cells included in the normal string. Particularly, the flag cells store various data for a plurality of operations. In a program operation, the flag cells store data for program states of memory cells included in a specific page. More specifically, the flag cells store data regarding the LSB program or the MSB program of the memory cells.

The gate of the source select transistor SST is coupled to a source select line SSL. The gates of the memory cells F0 to Fn are coupled to respective word lines WL0 to WLn. The gate of the drain select transistor DST is coupled to a drain select line DSL. The strings ST are coupled between the respective bit line BLe or BLo and the common source line CSL. The bit lines are divided into even-numbered bit lines (called even bit lines) BLe and odd-numbered bit lines (called odd bit lines) BLo according to the arrangement of the bit lines. Furthermore, the strings ST coupled to the even bit lines BLe are called even strings, and the strings coupled to the odd bit lines BLo are called odd strings.

The controller 120 internally generates a program operation signal PGM, a read operation signal READ, or an erase operation signal ERASE in response to a command signal CMD. The controller 120 also generates page buffer signals PB SIGNALS for controlling the page buffers PB of the page buffer group 150 according to a type of operation to be performed. Furthermore, the controller 120 internally generates a row address signal RADD and a column address signal CADD in response to an address signal ADD. The controller 120 checks whether the threshold voltages of memory cells have been raised to a target voltage according to a check signal PFS of the P/F check circuit 180 in a program or erase verify operation. The controller 120 further determines whether to perform a program operation or an erase operation again or to terminate the program operation or the erase operation according to the result of the check.

The voltage supply circuit (130, 140) supplies the drain select line DSL, the word lines WL0 to WLn, and the source select line SSL of the memory cell block with voltages for the program operation, the erase operation, or the read operation in response to the signals PGM, READ, ERASE, and RADD. The voltage supply circuit includes the voltage generator 130 and the row decoder 140.

The voltage generator 130 outputs operating voltages for programming, reading, or erasing memory cells (for example, Vpgm, Vpass, and Vread) to global lines in response to the signals PGM, READ, and ERASE. Particularly, in a program or read operation, the voltage generator 130 outputs a positive or negative voltage to a word line. To this end, the voltage generator 130 includes a circuit for generating the positive voltage and a circuit for generating the negative voltage.

The row decoder 140 transfers the operating voltages generated by the voltage generator 130 to the drain select line DSL, the source select line SSL, and the word lines WL0 to WLn of the memory cell block in response to the row address signal RADD.

The page buffer group 150 detects whether the memory cells are in the program or an erase state. The page buffer group 150 includes the page buffers PB each coupled to a pair of bit lines BLe and BLo. The page buffer group 150 supplies the bit lines BLe and BLo with voltages necessary to store data in the memory cells F0 to Fn in response to the page buffer signals PB SIGNALS.

More particularly, in the program operation, the erase operation, or the read operation of the memory cells F0 to Fn, the page buffer group 150 precharges the bit lines BLe and BLo or stores data, corresponding to the threshold voltages of the memory cells F0 to Fn, which are detected according to a shift in the voltages of the bit lines BLe and BLo in the latches of the page buffers PB. More particularly, in the program operation, each of the page buffers PB of the page buffer group 150 supplies a program permission voltage (for example, a ground voltage 0 V) to the bit lines BLe and BLo if program data stored in the latch of the page buffer PB is '0', and each of the page buffers PB supplies a program inhibition voltage (for example, a power source voltage Vcc) to the bit lines BLe and BLo if the program data stored in the latch of the page buffer PB is '1'. In the read operation, each of the page buffers PB controls the voltages of the bit lines BLe and BLo in response to data stored in the memory cells F0 to Fn and detects data stored in the memory cells F0 to Fn. Furthermore, each of the page buffers PB supplies an erase permission voltage (for example, a program inhibition voltage) to the bit lines BLe and BLo at an early stage of the erase operation and supplies a program permission voltage (for example, 0 V) to bit lines BLe and BLo coupled to erased strings ST in a program operation performed according to the result of an erase verify operation during the erase operation. The program permission voltage is determined depending on data stored in the latch of the page buffer PB according to the result of an erase verify operation.

The column selector 160 selects the page buffers PB in response to the column address signal CADD. Data stored in the latch of the page buffer PB selected by the column selector 160 is outputted. Furthermore, the column selector 160 receives data from the page buffer group 150 through a column line CL and transfers the data to the P/F check circuit 180.

The I/O circuit 170 transfers external data DATA to the column selector 160 under the control of the controller 120 during a program operation so that the external data DATA is inputted to the page buffers PB. When the external data DATA is sequentially transferred to the page buffers PB, the page buffers PB store the external data DATA in the latches of the page buffers PB. Furthermore, in a read operation, the I/O circuit 170 outputs data DATA received from the page buffers PB via the column selector 160 to a circuit outside of the semiconductor device.

The P/F check circuit 180 checks whether an error cell exists in a verify operation subsequent to a program or erase operation and outputs the result of the check in the form of the check signal PFS. Furthermore, the P/F check circuit 180 counts the number of error cells and outputs the result of the count in the form of a count signal CS.

The controller 120 controls the program voltage Vpgm supplied to a word line in the program operation and also controls the voltage generator 130 so that verify voltages can be selectively supplied to a word line in a program verify operation. In some embodiments, the controller 120 may control the voltage generator 130 in response to the check signal PFS of the P/F check circuit 180.

Figure 3A:
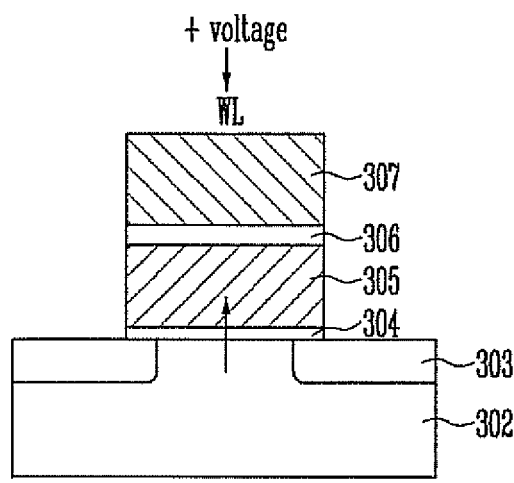
FIGS. 3A and 3B are cross-sectional views of a memory cell for illustrating the features of the program method according to this disclosure.
Figure 3B:
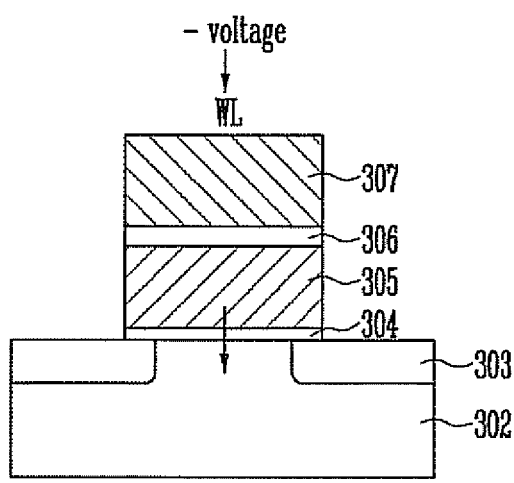

FIGS. 3A and 3B are cross-sectional views of a NAND flash memory cell for illustrating the features of the program method according to this disclosure.

Referring to FIG. 3A, the NAND flash memory cell is configured as follows. The memory cell is formed over a semiconductor substrate 302. A well is formed in the semiconductor substrate 302. The memory cell is configured to include a tunnel dielectric layer 304, a floating gate 305, a dielectric layer 306, and a control gate 307, which are sequentially stacked on the semiconductor substrate 302. The control gate 307 is coupled to a word line WL.

When a positive (+) voltage is supplied to the word line WL and a program permission voltage (for example, the ground voltage 0 V) is supplied to the well, electrons are induced into the floating gate 305, and the threshold voltage of the memory cell rises.

Referring to FIG. 3B, when a negative (−) voltage is supplied to the word line WL and the program permission voltage is supplied to the well, the electrons induced into the floating gate 305 exit to the well, and the threshold voltage of the memory cell drops.

In other words, when the positive voltage is supplied to the word line WL as in FIG. 3A and the program permission voltage is supplied to the well, the threshold voltage of the memory cell rises. When the negative voltage is supplied to the word line WL as in FIG. 3B and the program permission voltage is supplied to the well, the threshold voltage of the memory cell drops. If this principle is applied to a program operation, a memory cell can be programmed in various program states by using, for example, only a low program voltage without using a high program voltage (for example, 20 V). This operation is described in detail with reference to a graph of FIG. 4.

Figure 4:
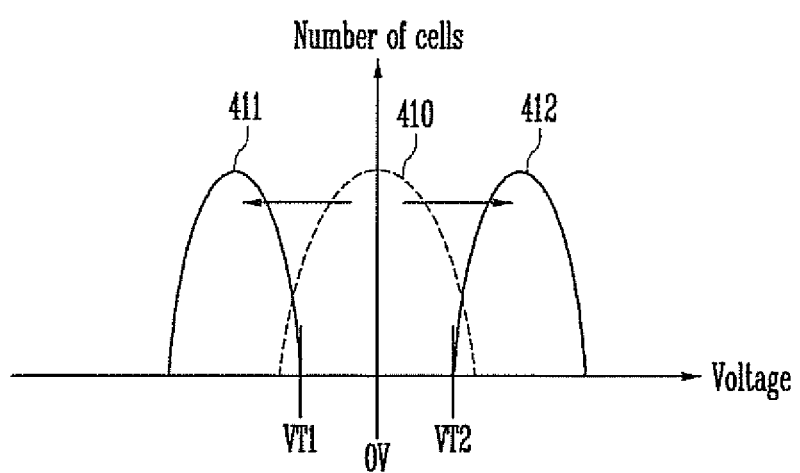
FIG. 4 is a graph illustrating threshold voltages according to a program operation of this disclosure.

FIG. 4 is a graph illustrating threshold voltages according to a program operation of this disclosure.

Referring to FIG. 4, in a conventional art, all the memory cells of a memory cell block are erased before memory cells selected from among all the memory cells are programmed. In this disclosure, however, an operation that shifts the threshold voltages of all the memory cells to a reference voltage is performed instead of the operation that erases all the memory cells. Thus, when the memory cell block is selected in response to the program command, and the operation of shifting the threshold voltages of all the memory cells of the memory cell block (hereinafter simply referred to as the memory cell block) to the reference voltage is subsequently performed without performing the operation of erasing all the memory cells of the memory cell block.

The reference voltage may be set in various ways, for example, the reference voltage may be set to a ground voltage 0 V. To shift the threshold voltages to the reference voltage of 0 V, an initial operation including a pre-program operation and a pre-erase operation is performed on the memory cell block. The pre-program operation is performed to raise a threshold voltage that is lower than the reference voltage 0 V, and the pre-erase operation is performed to lower a threshold voltage that is higher than the reference voltage 0 V.

The initial operation is described in detail below.

The pre-program operation may be performed in accordance with an Incremental Step Pulse Program (ISPP) method or may be performed by supplying one program voltage (or a program pulse) to all the word lines coupled to the memory cell block. For example, the pre-program operation may be performed by supplying a positive pre-program voltage to all the word lines while the program permission voltage is supplied to a well or a channel. The pre-program operation is performed to shift the threshold voltages of the memory cells, which are each lower than the reference voltage 0 V, to voltage 410 close to the reference voltage 0 V. Here, a verify operation for the pre-program operation may be omitted to reduce the time taken for the operation. More specifically, in the pre-program operation, a low voltage (for example, 10 V to 15V) higher than the ground voltage 0 V is supplied to all the word lines. Thus, the threshold voltages of memory cells that are each higher than the reference voltage 0 V do not rise, and the threshold voltages of memory cells that are each lower than the reference voltage 0 V rises in a stepwise manner.

The pre-erase operation is performed by supplying a negative pre-erase voltage to all the word lines while the program inhibition voltage is supplied to the well or the channel. The pre-erase operation is performed to lower the threshold voltages of memory cells, which are each higher than the reference voltage 0 V, to the voltage 410 close to the reference voltage 0 V. Here, a verify operation for the pre-erase operation may be omitted to reduce the time taken for the operation. More specifically, in the pre-erase operation, a pre-erase voltage (for example, −0.1 V to −5 V) lower than 0 V is supplied to all the word lines. Thus, the threshold voltages of memory cells that are each higher than the reference voltage 0 V may drop. An order in which the pre-program operation and the pre-erase operation are performed may be changed if necessary.

As described above, the threshold voltages of all the memory cells may be distributed among the voltage 410 close to the reference voltage 0 V by performing the initial operation.

A program operation for the memory cell block where the initial operation has been performed is described in detail below.

An erase operation is performed on memory cells to be programmed with a first state 411, which are selected from among memory cells included in a page selected from the pages of the memory cell block. More specifically, the erase operation is performed by supplying a negative erase voltage to a selected word line coupled to the selected page and a positive pass voltage to the remaining word lines while the program inhibition voltage Vcc is supplied to bit lines coupled to the selected memory cells. For example, the negative erase voltage may be −0.1 V to −5 V, and the positive pass voltage may be 7 V to 10 V. In order to generate channel boosting in a string, the positive pass voltage may be supplied to all the word lines before the negative erase voltage is supplied to the selected word line. Channel boosting is generated in relevant strings because of the positive pass voltage and the program inhibition voltage. When the negative erase voltage is supplied the selected word line, the memory cells coupled to the selected word line are erased, and the memory cells are in the first state 411. In the erase operation, a target level is a first target level VT1 that is lower than the reference voltage 0 V.

A program operation is performed on memory cells to be programmed with a second state 412, which is higher than the first state 411, selected from among the memory cells of the selected page. More specifically, the program operation is performed by supplying a positive program voltage to a selected word line coupled to the selected page and a positive pass voltage to the remaining word lines while the program permission voltage (for example, the ground voltage 0 V) is supplied to bit lines coupled to the selected memory cells. In the program operation, the positive program voltage may be 12 V to 15 V.

As described above, the memory cells may be programmed with the first state 411 or the second state 412, which is higher than the first state 411, by supplying the negative erase voltage or the positive program voltage to the selected word line. More specifically, after the threshold voltages of the memory cells are distributed close to the reference voltage 0 V, the memory cells may be programmed with the first or second state 411 or 412 by supplying the negative erase voltage or the positive program voltage to the selected word line. A program method of an MLC using the above principle is described below.

Figure 6A:
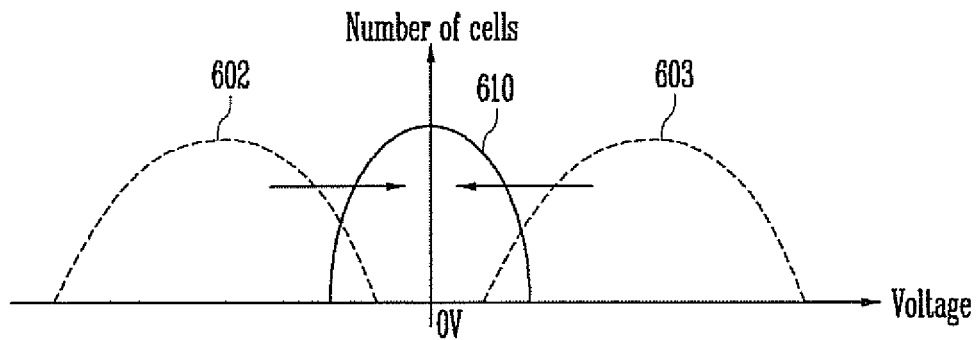
FIGS. 6A to 6C are graphs illustrating threshold voltages according to the program operation of FIG. 5.
Figure 6B:
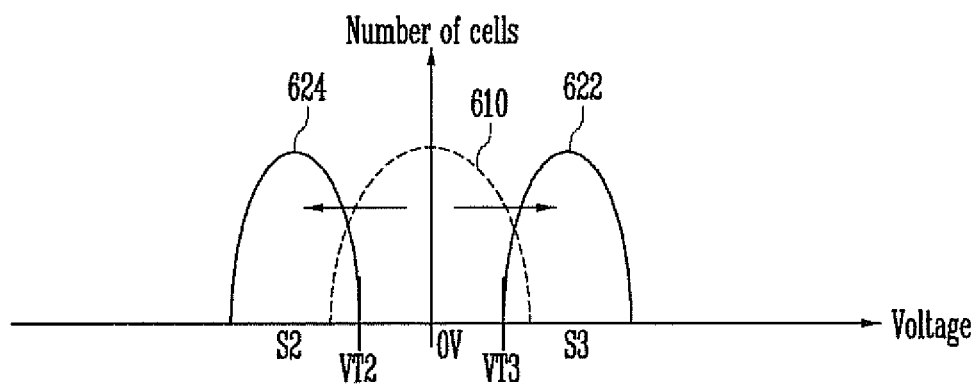
Figure 6C:
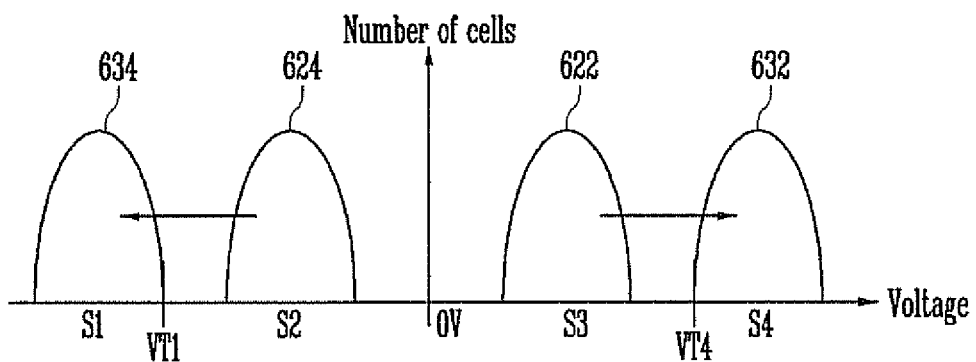
Figure 7:
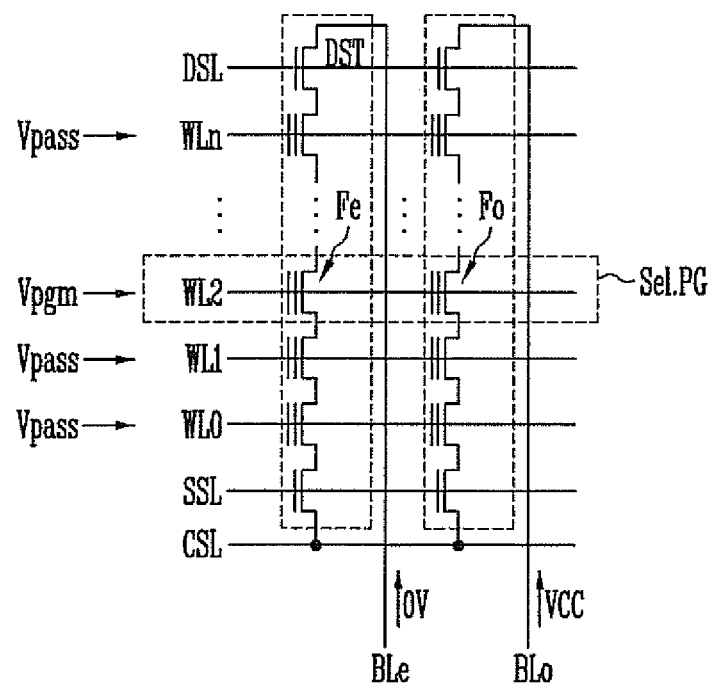
FIG. 7 is a circuit diagram of a memory cell block for illustrating voltages used in the program operation of FIG. 5.

FIG. 5 is a flowchart illustrating a program operation of the semiconductor device according to an embodiment of this disclosure, FIGS. 6A to 6C are graphs illustrating threshold voltages according to the program operation of FIG. 5, and FIG. 7 is a circuit diagram of a memory cell block for illustrating voltages used in the program operation of FIG. 5.

In the present embodiment, an MLC program method of programming one memory cell with four states so that selected memory cells are programmed with a first state S1, a second state S2 that is higher than the first state S1, a third state S3 that is higher than the second state S2, or a fourth state S4 that is higher than the third state S3.

First Step 502

Referring to FIGS. 5 and 6A, when the program operation of the memory cell block begins, all the memory cells of the memory cell block are reset. More specifically, since all the memory cells might have been programmed with various states 602 and 603, pre-program and pre-erase operations are performed on all the memory cells so that the threshold voltages of all the memory cells are shifted to a voltage state 610 close to a reference voltage. The reference voltage may be set to various levels, but preferably is set to a ground voltage 0 V. When the pre-program operation is performed on all the memory cells, the threshold voltages of memory cells that are each lower than the reference voltage rise to the voltage 610 close to the reference voltage. When the pre-erase operation is performed on all the memory cells, the threshold voltages of memory cells that are each higher than the reference voltage drop to the voltage 610 close to the reference voltage. More specifically, the threshold voltages of all the memory cells of the memory cell block are centered around the reference voltage.

Second Step 503

Referring to FIGS. 5, 6B, and 7, an LSB program operation is performed on a page Sel.PG (more specifically, the page Sel.PG is a group of memory cells coupled to the same word line) selected from among the plurality of pages included in the memory cell block. The LSB program operation is performed to program all the memory cells that are included in the selected page Sel.PG that are to be programmed with the third state S3 or the fourth state S4 so that the threshold voltages of all the memory cells become the third state S3. The LSB program operation may be performed in accordance with an ISPP method.

For the LSB program operation, the program permission voltage (for example, the ground voltage 0 V) is supplied to selected bit lines (for example, BLe), and the program inhibition voltage Vcc is supplied to the unselected bit lines (for example, BLo). While the program permission voltage or the program inhibition voltage is supplied to the bit lines BLe and BLo, a turn-off voltage is supplied to the source select line SSL, a turn-on voltage is supplied to the drain select line DSL, and a pass voltage Vpass is supplied to all the word lines WL0 to WLn. At this time, channel boosting is generated in strings coupled to the unselected bit lines BLo because of the pass voltage Vpass and the program inhibition voltage. Next, the threshold voltages of selected memory cells Fe coupled to the respective selected bit lines BLe are raised by supplying a positive program voltage Vpgm to a selected word line WL2 coupled to the selected page Sel.PG (622).

For example, the turn-off voltage may be 0 V, the turn-on voltage may be 2 V to 3 V, the positive program voltage Vpgm may be 12 V to 15 V, and the pass voltage Vpass may be 7 V to 10 V. The power source voltage Vcc is supplied to the common source select line CLS. In the LSB program operation, the program operation and a verify operation are repeated until the threshold voltages of all the selected memory cells Fe reach a third target voltage VT3. The third target voltage VT3 is set to be higher than the reference voltage 0 V. During the LSB program operation, the unselected memory cells Fo coupled to the unselected bit lines BLo maintain the initial state 610 without being programmed because of channel boosting occurs in strings coupled to the unselected bit lines BLo.

Third Step 504

Referring to FIGS. 5, 6B, and 7, an LSB erase operation is performed on the selected page Sel.PG selected. The LSB erase operation is performed to erase all the memory cells that are included in the selected page Sel.PG and are to be programmed with the second state S2 or the first state S1 so that the threshold voltages of all the memory cells have the second state S2. The LSB erase operation may be performed in accordance with an Incremental Step Pulse Erase (ISPE) method.

In the third step 504, the selected bit lines BLe in the second step 503 are unselected bit lines BLe in the third step 504. Accordingly, in the third step 504, the erase permission voltage (for example, the program inhibition voltage) is supplied to the selected bit lines BLo, and the erase inhibition voltage (more specifically, the program permission voltage) is supplied to the unselected bit lines BLe. While the erase permission voltage or the erase inhibition voltage is supplied to the bit lines BLe and BLo, a turn-off voltage is supplied to the source select line SSL, a turn-on voltage is supplied to the drain select line DSL, and the pass voltage Vpass is supplied to all the word lines WL0 to WLn. At this time, channel boosting is generated in strings coupled to the selected bit lines BLo because of the pass voltage Vpass and the erase permission voltage. In other words, an electric potential of a channel rises.

Next, when a negative erase voltage Vpgm is supplied to the selected word line WL2 coupled to the selected page Sel.PG, the electrons of selected memory cells Fo coupled to the selected bit lines BLo exit to the well because of a potential difference between the channel and the selected word line WL2. Thus, the threshold voltages of the selected memory cells Fo drop (624). For example, the negative erase voltage Vpgm may be −0.1 V to −5 V, and the pass voltage Vpass may be 7 V to 10 V. Here, to prevent the leakage of the channel, the power source voltage Vcc is supplied to the common source select line CSL. In the LSB erase operation, the erase operation and a verify operation are repeated until the threshold voltages of all the selected memory cells Fo reach the second target voltage VT2. The second target voltage VT2 is set lower than the reference voltage. If the reference voltage is 0 V, the second target voltage VT2 has a negative voltage.

Fourth Step 505

Referring to FIGS. 5, 6C, and 7, an MSB program operation is performed on the selected page Sel.PG. The MSB program operation is performed to program memory cells Fe, which are selected from among the memory cells 622 on which the LSB program operation has been performed in the second step 503 so that the threshold voltages of the selected memory cells Fe have the fourth state S4. The MSB program operation may be performed in accordance with an ISPP method.

For the MSB program operation, the program permission voltage (for example, the ground voltage 0 V) is supplied to the selected bit lines BLe coupled to the selected memory cells Fe, and the program inhibition voltage Vcc is supplied to the unselected bit lines BLo. While the program permission voltage or the program inhibition voltage is supplied to the bit lines BLe and BLo, a turn-off voltage is supplied to the source select line SSL, a turn-on voltage is supplied to the drain select line DSL, and the pass voltage Vpass is supplied to all the word lines WL0 to WLn. At this time, channel boosting is generated in the strings coupled to the unselected bit lines BLo because of the pass voltage Vpass and the program inhibition voltage.

Next, the threshold voltages of the selected memory cells Fe are raised by supplying a positive program voltage Vpgm to the selected word line WL2 coupled to the selected page Sel.PG (632). For example, the turn-off voltage may be 0 V, the turn-on voltage may be 2 V to 3 V, the positive program voltage Vpgm may be 12 V to 15 V, and the pass voltage Vpass may be 7 V to 10 V. The power source voltage Vcc is supplied to the common source select line CLS. In the MSB program operation, the program operation and a verify operation are repeated until the threshold voltages of all the selected memory cells Fe reach the fourth target voltage VT4. During the MSB program operation, the unselected memory cells Fo coupled to the unselected bit lines BLo maintain the previous state 622 without being programmed because of channel boosting generated in strings coupled to the unselected bit lines BLo.

Fifth Step 506

Referring to FIGS. 5, 6C, and 7, an MSB erase operation is performed on the selected page Sel.PG. The MSB erase operation is performed to erase memory cells Fo selected from among the memory cells 624 on which the LSB erase operation has been performed in the third step 504 so that the threshold voltages of the selected memory cells Fo have the first state S1. The LSB erase operation may be performed in accordance with an ISPE method.

More specifically, in the fifth step 506, the selected bit lines BLe in the fourth step 505 are the unselected bit lines BLe in the fifth step 506. Accordingly, in the fifth step 506, the erase permission voltage (for example, the program inhibition voltage) is supplied to the selected bit lines BLo, and the erase inhibition voltage (for example, the program permission voltage) is supplied to the unselected bit lines BLe. While the erase permission voltage or the erase inhibition voltage is supplied to the bit lines BLe and BLo, a turn-off voltage is supplied to the source select line SSL, a turn-on voltage is supplied to the drain select line DSL, and the pass voltage Vpass is supplied to all the word lines WL0 to WLn. At this time, channel boosting is generated in strings coupled to the selected bit lines BLo because of the pass voltage Vpass and the erase permission voltage. More specifically, an electric potential of the channel rises.

Next, when the negative erase voltage Vpgm is supplied to a selected word line WL2 coupled to the selected page Sel.PG, the electrons of the selected memory cells Fo exit to the well because of a potential difference between the channel and the selected word line WL2. Accordingly, the threshold voltages of the selected memory cells Fo drop (634). For example, the negative erase voltage Vpgm may be −0.1 V to −5 V, and the pass voltage Vpass may be 7 V to 10 V. To prevent the leakage of the channel, the power source voltage Vcc is supplied to the common source select line CLS. In the MSB erase operation, the erase operation and a verify operation are repeated until the threshold voltage of all the selected memory cells Fo reach the first target voltage VT1. The first target voltage VT1 is set lower than the reference voltage. If the reference voltage is 0 V, the second target voltage VT2 has a negative voltage.

As described above, each of selected memory cells is programmed to have a target voltage higher than a reference voltage or is erased to have a target voltage lower than the reference voltage. Thus, the selected memory cells can be programmed without using a high positive program voltage. Accordingly, program and read operations may be more reliable because interference between adjacent memory cells can be prohibited in a program operation.

Furthermore, the occurrence of interference can be prevented because a low program voltage is used in a selected word line in a program operation. Accordingly, program and read operations may be more reliable because a shift in the threshold voltages of memory cells in a program operation can be suppressed.

What is claimed is:

1. An operating method of a semiconductor device that includes a plurality of memory cell blocks, comprising:
    selecting one of the memory cell blocks in response to a program command;
    performing a pre-program operation and a pre-erase operation so that threshold voltages of memory cells included in the selected memory cell block are distributed between a first positive voltage and a first negative voltage;
    supplying a program permission voltage to a first group of bit lines and supplying a program inhibition voltage to a second group of bit lines, wherein the first group and the second group are mutually exclusive; and
    supplying a positive program voltage to a selected word line coupled to memory cells.

2. The operating method of claim 1, wherein the pre-program operation is performed to raise threshold voltages of memory cells having an erase state from among the memory cells of the selected memory cell block, and to maintain threshold voltages of memory cells having a program state from among the memory cells of the selected memory cell block.

3. The operating method of claim 1, wherein the pre-program operation comprises:
supplying the program permission voltage to the bit lines of the selected memory cell block; and
supplying a positive pre-program voltage to word lines coupled to the selected memory cell block.

4. The operating method of claim 1, wherein the pre-erase operation is performed to lower threshold voltages of memory cells having a program state from among the memory cells of the selected memory cell block, and to maintain the threshold voltages of pre-programmed memory cells.

5. The operating method of claim 1, wherein the pre-erase operation comprises:
supplying the program permission voltage to bit lines coupled to the selected memory cell block; and
supplying a negative pre-erase voltage to word lines coupled to the selected memory cell block.

6. The operating method of claim 1, wherein a pass voltage is supplied to remaining word lines when the positive program voltage is supplied to the selected word line.

7. The operating method of claim 1, further comprising performing a negative erase operation so that threshold voltages of memory cells other than the selected memory cells reach a negative target voltage, after supplying the positive program voltage.

8. The operating method of claim 7, wherein the negative erase operation comprises:
supplying a negative erase voltage to the selected word line, and supplying a pass voltage to word lines other than the selected word line in the selected memory cell block.

9. The operating method of claim 7, further comprising generating channel boosting in strings coupled to the second group of bit lines before performing the negative erase operation.

10. The operating method of claim 9, wherein the channel boosting is generated by supplying a positive pass voltage to word lines coupled to the selected memory cell block.

11. The operating method of claim 1, wherein the program permission voltage is a ground voltage.

12. The operating method of claim 1, wherein the program inhibition voltage is a power source voltage.

13. The operating method of claim 1, wherein the first group of bit lines is coupled to selected memory cells, and the second group of bit lines is coupled to remaining memory cells.

14. An operating method of a semiconductor device that includes a plurality of memory cell blocks on which a program operation has been performed, comprising:
selecting one of the memory cell blocks in response to a program command;
performing a pre-program operation and a pre-erase operation so that threshold voltages of memory cells included in the selected memory cell block are distributed between a first positive voltage and a first negative voltage;
supplying a program permission voltage to a first group of bit lines and supplying a program inhibition voltage to a second group of bit lines, wherein the first group and the second group are mutually exclusive;
performing a first positive program operation so that threshold voltages of memory cells that are selected from among the memory cells reach a first positive target voltage; and
performing a second positive program operation so that threshold voltages of memory cells that are selected from among the memory cells each having the threshold voltage that reached the first positive target voltage reach a second target voltage higher than the first positive target voltage.

15. The operating method of claim 14, wherein the pre-program operation is performed to raise threshold voltages of memory cells having an erase state from among the memory cells of the selected memory cell block, and to maintain threshold voltages of memory cells having a program state from among the memory cells of the selected memory cell block.

16. The operating method of claim 15, wherein the pre-program operation comprises:
supplying the program permission voltage to the bit lines of the selected memory cell block; and
supplying a positive pre-program voltage to word lines coupled to the selected memory cell block.

17. The operating method of claim 14, wherein the pre-erase operation is performed to lower threshold voltages of memory cells having a program state from among the memory cells of the selected memory cell block, and to maintain the threshold voltages of pre-programmed memory cells.

18. The operating method of claim 17, wherein the pre-erase operation comprises:
supplying the program permission voltage to bit lines coupled to the selected memory cell block; and
supplying a negative pre-erase voltage to word lines coupled to the selected memory cell block.

19. The operating method of claim 14, wherein the first positive program operation comprises:
supplying a stepwise rising positive program voltage to a selected word line coupled to the selected memory cells; and
supplying a pass voltage to word lines other than the selected word line.

20. The operating method of claim 19, wherein the first positive program operation comprises repeating a positive program operation and a verify operation until the threshold voltages of the selected memory cells reach the first positive target voltage.

21. The operating method of claim 19, wherein the second positive program operation comprises:
supplying a stepwise rising positive program voltage higher than the first positive program voltage to the selected word line; and
supplying the pass voltage to the word lines other than the selected word line.

22. The operating method of claim 14, further comprising performing a first negative erase operation so that threshold voltages of memory cells other than the selected memory cells from among the memory cells of the selected memory cell block reach a third negative target voltage, wherein the first negative erase operation is performed before the first positive program operation and the second positive program operation.

23. The operating method of claim 22, wherein the first negative erase operation comprises:
supplying a negative erase voltage to a selected word line coupled to the selected memory cells; and
supplying a pass voltage to word lines other than the selected word line.

24. The operating method of claim 22, wherein the first negative erase operation comprises repeating a negative erase operation and a verify operation until the threshold voltages of the selected memory cells reach the third negative target voltage.

25. The operating method of claim 22, further comprising performing a second negative erase operation so that threshold voltages of memory cells that are selected from among the memory cells each having the threshold voltage that reached the third negative target voltage, reach a fourth target voltage lower than the third negative target voltage, wherein the second negative erase operation is performed after the second positive program operation.

26. The operating method of claim 25, wherein the second negative erase operation comprises:
  supplying a second negative erase voltage that is lower than the first negative erase voltage and stepwise drops to the selected word line, and
  supplying a pass voltage to word lines other than the selected word line.

27. The operating method of claim 22, further comprising generating channel boosting in strings coupled to the second group of bit lines before performing the first negative erase operation.

28. The operating method of claim 27, wherein the channel boosting is generated by supplying a positive pass voltage to word lines coupled to the selected memory cell block.

29. The operating method of claim 14, wherein the program permission voltage is a ground voltage and the program inhibition voltage is a power source voltage.

30. The operating method of claim 14, wherein the first group of bit lines is coupled to selected memory cells, and the second group of bit lines is coupled to remaining memory cells.

* * * * *